United States Patent [19]

Baba et al.

[11] Patent Number: 4,903,091
[45] Date of Patent: Feb. 20, 1990

[54] HETERJUNCTION TRANSISTOR HAVING BIPOLAR CHARACTERISTICS

[75] Inventors: Toshio Baba; Masaki Ogawa; Keiichi Ohata, all of Tokyo, Japan

[73] Assignee: NEC Corporation, Tokyo, Japan

[21] Appl. No.: 197,485

[22] Filed: May 23, 1988

Related U.S. Application Data

[63] Continuation of Ser. No. 848,188, Apr. 4, 1986, abandoned.

[30] Foreign Application Priority Data

Apr. 5, 1985 [JP] Japan .................................. 60-72154
Apr. 5, 1985 [JP] Japan .................................. 60-72163

[51] Int. Cl.$^4$ ............................................ H01L 29/80
[52] U.S. Cl. .......................................... 357/22; 357/16
[58] Field of Search ........... 357/16, 22, 22 A, 22 MD

[56] References Cited

U.S. PATENT DOCUMENTS

| | | | |
|---|---|---|---|
| 4,194,935 | 3/1980 | Dingle et al. | 357/33 A |
| 4,468,851 | 9/1984 | Wieder et al. | 357/22 A |
| 4,471,367 | 9/1984 | Chen et al. | 357/22 A |
| 4,499,481 | 2/1985 | Greene | 357/22 A |
| 4,590,502 | 5/1986 | Morkoc | 352/22 A |
| 4,677,457 | 6/1987 | Wolter | 357/22 A |
| 4,734,750 | 3/1988 | Okamura et al. | 357/22 |

FOREIGN PATENT DOCUMENTS

| | | | |
|---|---|---|---|
| 58-143572 | 8/1983 | Japan | 357/22 MD |
| 60-28273 | 2/1985 | Japan | 357/22 MD |
| 60-193382 | 10/1985 | Japan | 357/22 MD |

Primary Examiner—Joseph E. Clawson, Jr.
Attorney, Agent, or Firm—Sughrue, Mion, Zinn, Macpeak & Seas

[57] ABSTRACT

A heterojunction transistor has a first semiconductor layer of a semi-insulating or a low impurity concentration, a second semiconductor layer formed on the first semiconductor layer and made of such a semiconductor material that, in cooperation with the first semiconductor layer, a first energy recess for electrons and a second energy recess for holes are respectively formed at the bottom of the conduction band and at the top of the valence band to constitute a conductive channel, a third semiconductor layer formed on the second semiconductor layer and forming a PN-junction with the upper surface of the second semiconductor layer to inject carriers into the conductive channel, a control electrode for applying an input signal to the third semiconductor layer, and a ground and an output electrode formed on the second semiconductor layer on the opposite sides of the third semiconductor layer.

3 Claims, 2 Drawing Sheets

BIPOLAR CHARACTERISTICS

This is a continuation of application Ser. No. 848,188 filed 4-4-86, abandoned.

BACKGROUND OF THE INVENTION

1. Field of the Invention

The present invention relates to a heterojunction transistor having a high mutual conductance and operable at a high speed.

2. Description of the Prior Art

As an active semiconductor device operable at a high speed, an FET (Field Effect Transistor) making use of two-dimensional electrons at a hetero-boundary surface between semiconductors, has been known (for instance, Japan Journal of Applied Physics 19 (1988) L255). This device is characterized in that, at a hetero-boundary between semiconductors having different electron affinities (for example, $Al_xG_{1-x}As/GaAs$), only the semiconductor having a smaller electron affinity is doped with donor impurities to generate two-dimensional electrons on the side of the semiconductor having a larger electron affinity, and in that a high mobility of these two-dimensional electrons is utilized. However, in view of an operation mechanism, this FET can be deemed as one kind of MISFET (Metal Insulator Semiconductor FET) in which a semiconductor having a wide energy gap is used in place of an insulator film, and hence it has similar advantages and shortcomings to a MOSFET (Metal-Oxide-Semiconductor FET). A MIS FET is easy to be integrated to a high degree of integration, because the process is short as compared to a bipolar transistor and a planar structure is easy to be manufactured. On the other hand, since a mutual conductance which represents a load driving capability of a device is lowered as the sizes of the elements are microfined, a proportion of delay caused by increase of a wiring capacitance associated with high integration and by driving of an external load, is increased. Accordingly, to enhance the speed of the overall system is not so easy as in the case of the bipolar transistors.

A bipolar transistor having a high load driving capability of the type that electrons are injected into two-dimensional electron gas, is disclosed in U.S. patent application Ser. No. 807,935 filed on Dec. 12, 1985 and assigned to the same assignee as this application. More particularly, on a semi-insulating substrate is formed a low impurity concentration GaAs layer, then an n-type $Al_xGa_{1-x}As$ layer in which x changes gradually from 0.3 to 0 is formed thereon, and on one part of the layer is formed a p-type GaAs layer. On this p-type GaAs layer is deposited a metallic gate electrode, and source and drain electrodes made of Au-Ge are deposited on the n-type GaAs layers on the opposite sides.

Two-dimensional electron gas is produced on the surface of the low impurity concentration GaAs layer and a transistor action is provided by modulating a source-drain conductivity relying upon this two-dimensional electron gas. Especially, the gate electrode is applied with such voltage that the junction between the p-type GaAs layer and the n-type GaAs layer is forward biased. Due to such gate bias, electrons are injected into the two-dimensional electron gas, and a source-drain conductivity is increased. Thereby, despite of a heterojunction transistor, a large load driving capability and a high speed operating characteristic similar to a bipolar transistor were obtained.

However, in such heterojunction field effect transistor in the prior art, while at the bottom of the conduction band in the energy band structure under he gate electrode, a recess accumulating electrons exists, a recess accumulating holes does not exist, at the top of valence band. Therefore, further improvement is desired in the load driving capability and the high speed operation characteristic.

SUMMARY OF THE INVENTION:

One object of the present invention!is to provide a heterojunction transistor having further improved load driving capability and high speed operation characteristic.

According to one feature of the present invention, there is provided a semiconductor device comprising a first semiconductor layer having a low impurity concentration, a second semiconductor layer formed on the first semiconductor layer and consisting of a semiconductor whose electron affinity is smaller than that of the first semiconductor layer, at least an upper portion thereof being of one conductivity type, the second semiconductor layer having a recess at the bottom of the conduction band, which collects two-dimensional electrons in view of an energy band structure, at a boundary surface with the first semiconductor layer on the side of the first semiconductor layer, and further having a recess at the top of the valence band, which collect positive holes in view of an energy band structure, in this second semiconductor layer, a third semiconductor layer of the other conductivity type which forms a pn-junction contiguously to the top of a part of the upper layer portion of the second semiconductor layer, a control electrode contiguous to the third semiconductor layer and a ground electrode and an output electrode contiguous to the second semiconductor layer on the opposite sides of the third semiconductor layer.

The second semiconductor layer can be composed of a first partial semiconductor layer having a smaller electron affinity than the first semiconductor layer, and a second partial semiconductor layer of the one conductivity type formed on the first partial semiconductor layer having a smaller electron affinity than the first semiconductor layer and a smaller sum of an electron affinity and a forbidden band gap than the first partial semiconductor layer.

Alternatively, the second semiconductor layer can be composed of a semiconductor of the one conductivity type having a smaller electron affinity and a smaller sum of an electron affinity and a forbidden band gap than the first semiconductor layer.

In the semiconductor device according to the present invention, when a bias voltage is applied to the control electrode so as to forward bias the pn-junction formed between the upper layer portion of the second semiconductor layer and the third semiconductor layer, electrons are accumulated in the recess at the bottom of the conduction band in the energy band structure, and thereby a conductivity of the two-dimensional electron gas is increased. Besides, positive holes are also accumulated in the recess at the top of the valence and in the energy band structure. By these positive holes also, the conductivity between the ground electrode and the output electrode is further increased. In addition, these positive holes act to collect electrons and serve to further increase the amount of electrons in the two dimensional electron gas formed in the recess at the bottom of the conduction band in the energy band structure, and as a result, the conductivity between the ground electrode and the output electrode is exponentially increased as a function of the gate bias:!voltage, hence a high mutual conductance is provided, and the load driving capability as well as the high speed operation characteristic can be remarkably improved.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Figure 1:
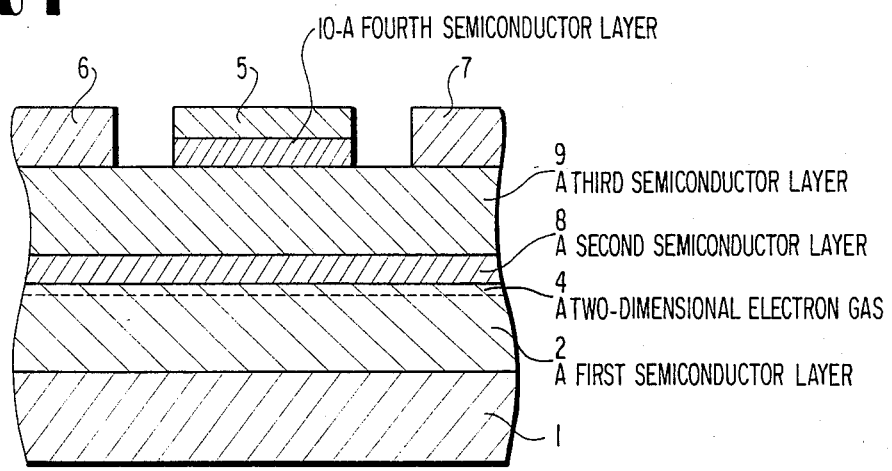
FIG. 1 is a cross-sectional view showing a first preferred embodiment of the present invention.
Figure 2:
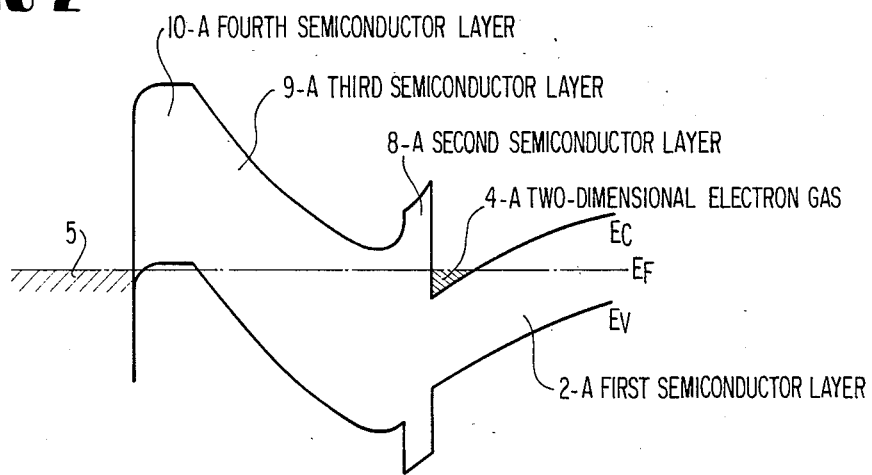
FIG. 2 is a diagram of an energy band structure under a gate electrode in the first preferred embodiment shown in FIG. 1.

A first preferred embodiment of the present invention made of four semiconductor layers is illustrated in FIGS. 1 and 2. On a substrate 1 of semi-insulating semiconductor is provided a first semiconductor layer 2 having a slight concentration of impurities. On the first semiconductor layer 2 are provided a second semiconductor layer 8 having a smaller electron affinity than the first semiconductor layer 2, and a third semiconductor layer 9 having a smaller electron affinity than the first semiconductor layer 2 and a smaller sum of an electron affinity and a forbidden band gap and containing n-type impurities. On a part of the third semiconductor layer 9 is provided a fourth semiconductor layer 10 containing p-type impurities at a high concentration, and on the third semiconductor layer 9 a source electrode 6 and a drain electrode 7 are provided on opposite sides of the fourth semiconductor layer 10.

Here, the energy level $E_v$ at the bottom of the valence band of the second semiconductor layer 8 could be either higher or lower than the energy level $E_v$ of the first semiconductor layer 2. Also, while the second semiconductor layer 8 may contain n-type impurities, for the purpose of suppressing a gate leakage current, it had better not contain the impurities. Furthermore, although the thickness of the second semiconductor layer 8 had better be thin, a thickness that is enough to prevent positive holes from passing through from the third semiconductor layer 9 to the first semiconductor layer 2 by the tunnel effect, is necessary. While this thickness is different depending upon a magnitude of the difference in the energy level $E_v$ between the second semiconductor layer 8 and the third semiconductor layer 9, generally a thickness of several Å to several tens Å would suffice. The material of the fourth semiconductor layer 10 could be any one so long as it can inject positive holes into the third semiconductor layer 9, but for the purpose of enhancing an injection efficiency, at the surface held into contact with the fourth semiconductor layer, the same material as the third semiconductor layer 9 or a material having a larger sum of an electron affinity and a forbidden gap than the third semiconductor layer 9, is preferable.

As one example which can realize the structure according to the above-mentioned preferred embodiment, there is known a semiconductor device, in which the first semiconductor layer 2 is made of high purity GaAs, the second semiconductor layer 8 consists of an AlAs layer of about 20 Å in thickness, the semiconductor layer 9 consists of an n-$Al_{0.3}Ga_{0.7}As$ layer of about 500 Å in thickness having an n-type impurity concentration of about $1 \times 10^{18} cm^{-3}$, and the fourth semiconductor layer 10 consists of a p+-$Al_{0.3}Ga_{0.7}As$ layer of about 100 Å in thickness having a p-type impurity concentration of about $1 = 10^{19} cm^{-3}$ or more.

Now, assuming that the above-described materials were used for the respective semiconductor layers, the operation of the above-described preferred embodiment will be explained in greater detail with reference to FIG. 2 which is a band structure diagram.

FIG. 2 shows a band structure under the gate electrode of the FET shown in FIG. 1, and this diagram shows an energy level $E_c$ at the bottom of the conduction band, a Fermi level $E_F$ and an energy level $E_v$ at the top of the valence band, in the respective semiconductor layers 2, 8, 9 and 10. This band diagram represents a thermal equilibrium state, and in order to facilitate understanding of the band structure, the state where two-dimensional electron gas 4 has been formed (depletion mode) is shown. In an FET for super high speed operations, under a thermal equilibrium state it is preferable to use the state where the two-dimensional electron gas 4 is not formed (enhancement mode).

If a positive voltage is applied to the gate electrode, then the junction between the p+-$Al_{0.3}Ga_{0.7}As$ layer 10 and the n-$Al_{0.3}Ga_{0.7}As$ layer 9 takes a forward biased state. At this time, since the n-$Al_{0.3}Ga_{0.7}As$ layer 9 is almost perfectly depleted, injection of electrons from the n-$Al_{0.3}Ga_{0.7}As$ layer 9 into the p+-$Al_{0.3}Ga_{0.7}As$ layer 10 caused by the forward bias can be almost neglected. On the other hand, injection of positive holes from the p+-$Al_{0.3}Ga_{0.7}As$ layer 10 to the n-$Al_{0.3}Ga_{0.7}As$ layer 9 is remarkable. The injected positive holes would pass through the n-$Al_{0.3}Ga_{0.7}As$ layer 9 and would reach the boundary surface between the n-$Al_{0.3}Ga_{0.7}As$ layer 9 and the AlAs layer 8, but since a barrier against positive holes is present here, the positive holes would accumulate at this boundary surface. Most of the accumulated positive holes would move to the side of the source electrode through the n-$Al_{0.3}Ga_{0.7}As$ layer 9 due to an electric field between the source and the gate. Also, a part of them would thermally go over the AlAs barrier or penetrate therethrough by a tunnel effect and enter the GaAs layer, and then they move to the source electrode or disappear by recombination with electrons. If positive holes are accumulated at the n-$Al_{0.3}Ga_{0.7}As$/AlAs boundary surface, then two dimensional electrons are induced at the AlAs/GaAs boundary surface in accordance with the amount of the positive holes. As the induced two-dimensional electrons have a high mobility, they flow momentarily to the drain side due to the electric field between the source and the drain, and as a result, two-dimensional electrons are induced again by the positive holes. Accordingly, the positive holes injected from the p+-$Al_{0.3}Ga_{0.7}As$ layer 10 would induce a large number of two-dimensional electrons before they are absorbed by the source electrode, and hence a ratio (a current amplification factor $\beta$) of a drain current to a gate current (principally a positive hole current) becomes very large. In addition, since the number of the positive holes injected from the p+-Al$_{0.3}$Ga$_{0.7}$As layer 10 to the n-Al$_{0.3}$Ga$_{0.7}$As layer 9 is increased as an exponential function of the forward bias voltage (nearly corresponding to the gate voltage), a mutual conductance also increases exponentially in accordance with increase of the gate voltage, and becomes very large.

As described above, the transistor according to the above-mentioned preferred embodiment is structurally similar to the two-dimensional electron gas FET in the prior art, but with respect to operating characteristic it is similar to the bipolar transistor, and with respect to a structure, it is provided with both a structure suitable for high integration similar to an FET in MOS integrated circuits and a high mutual conductance possessed by the bipolar transistor.

In manufacture of the transistor according to the above-described embodiment, at first as a method of crystal growth, MBE (Molecular Beam Epitaxy) was employed, thereby a high purity GaAs layer 2 of 1 μm in thickness was grown on a semi-insulating GaAs substrate 1, and subsequently, a high purity AlAs layer 8 of 20 Å in thickness, an n-Al$_{0.4}$Ga$_{0.6}$As layer 9 of 300 Å in thickness containing Si impurities at a concentration of $1 \times 10^{18}$cm$^{-3}$, and a p+-Al$_{0.4}$Ga$_{0.6}$As layer 10 of 100 Å in thickness containing Be impurities at a concentration of $3 \times 10^{19}$cm$^{-3}$, were grown. Next, Al was vapor deposited and patterned to form a gate electrode 5, then unnecessary p+-Al$_{0.4}$Ga$_{0.6}$As was removed by using the gate electrode 5 as a mask, source and drain electrodes 6 and 7 made of AuGe/An were vapor deposited and alloyed, and thereby a transistor was completed. As a result, in a transistor having a gate length of 0.5 μm, and gate-source and gate-drain distances of 0.5 μm, the characteristics of gm=5000 mS/mm (per 1 mm gate width) and β=200 were obtained.

While GaAs/AlGaAs was disclosed as semiconductor materials in the above-described preferred embodiment of the present invention, obviously other semiconductor materials (for instance, InGaAs/InP/InAlAs) could be employed.

The second to fourth semiconductor layers in the above-described preferred embodiment need not have uniform compositions nor need not be uniformly doped. A super-lattice having a short period may be employed, and variation of compositions and variation of doping in the thicknesswise direction could be given to the semiconductor layers. A super-lattice having a short period has a merit that all the first to fourth semiconductor layers can be realized by means of two materials. The variation of the composition is important in view of protection of a surface layer (For instance, the third semiconductor layer is gradually varied from n-Al$_{0.3}$Ga$_{0.7}$As to n-GaAs.). The variation of the doping is important for the purpose of enhancing an injection efficiency of positive holes (the upper portion of the third semiconductor layer being made to have a low impurity concentration). In addition, with regard to formation of the source and drain electrodes, they could be formed not only on the third semiconductor but at the location where this semiconductor layer was dug down, or else, the fourth semiconductor was left and they could be deposited thereon.

Figure 3:
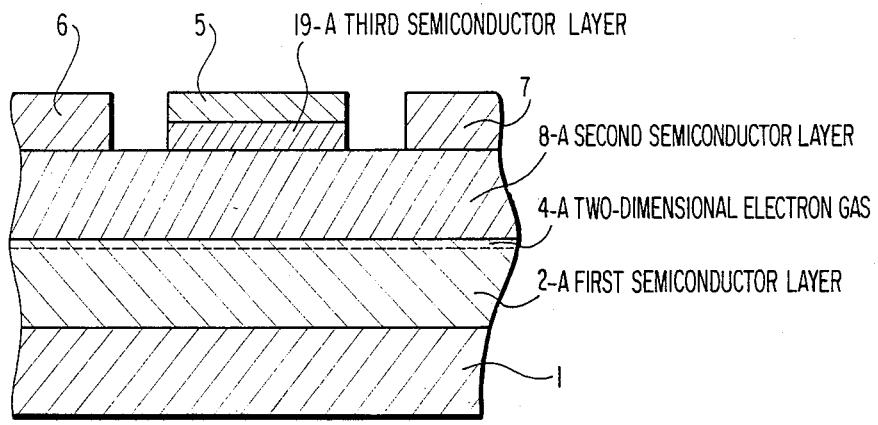
FIG. 3 is a cross-sectional view showing a second preferred embodiment of the present invention.
Figure 4:
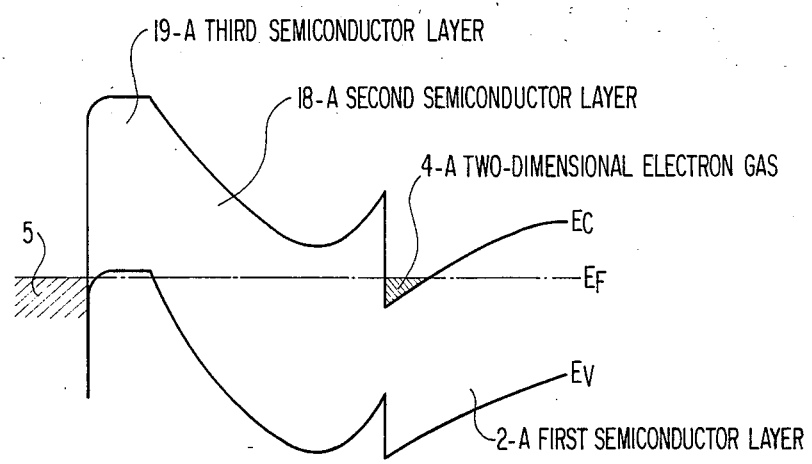
FIG. 4 is a diagram of an energy band structure under a gate electrode in the second preferred embodiment shown in FIG. 3.

Now, a second preferred embodiment of the present invention in which a transistor is realized by using three semiconductor layers, will be explained with reference to FIGS. 3 and 4. Similarly to the first preferred embodiment, on a semi-insulating semiconductor substrate 1 is provided a first semiconductor layer 2 having its impurity minimized. On this first semiconductor layer 2 is provided a second semiconductor layer 18 having a smaller electron affinity than the first semiconductor layer 2 and a smaller sum of an electron affinity and a forbidden gap then the first semiconductor layer 2 and containing an n-type impurity, and on one portion of this second semiconductor layer 18 is provided a third semiconductor layer 19 containing a p-type impurity at a high concentration. While the material of the third semiconductor layer 19 could be any material so long as it can inject positive holes into the second semiconductor layer 18, for the purpose of enhancing the injection efficiency the same material as the second semiconductor layer 18 at the surface contiguous to the third semiconductor layer 19 or a material having a larger sum of an electron affinity and a forbidden band gap than the second semiconductor layer 18, is preferable. On the second semiconductor layer 18 on the opposite sides of the third semiconductor layer 19 are provided a source electrode 6 and a drain electrode 7.

As one example which can realize the structure according to the above-mentioned second preferred embodiment, there is known a semiconductor device, in which the first semiconductor layer 2 is made of high purity InP, the second semiconductor layer 18 consists of an n-AlInAs layer of about 500 Å in thickness having an n-type impurity concentration of about $1 \times 10^{18}$cm$^{-3}$ and matched in lattice with the InP (in the following it is assumed that AlInAs is likewise matched with the InP.), and the third semiconductor layer 19 consists of a p+-AlInAs layer of about 100 Å in thickness having a p-type impurity concentration of $1 \times 10^{19}$cm$^{-3}$ or more.

Now, assuming that the above-described materials were used for the respective semiconductor layers, the operation of the above-described second preferred embodiment will be explained with reference to FIG. 4 which shows an energy level $E_c$ at the bottom of the conduction band, a Fermi level $E_F$ and an energy level $E_v$ at the top of the valence band, in the respective semiconductor layers 2, 18 and 19. This band diagram represents a thermal equilibrium state, and in order to facilitate understanding of the band structure, the state where two-dimensional electron gas 4 has been formed (depletion mode) is shown. In an FET for super high speed operation, under a thermal equilibrium state it is preferable to use the state where the two-dimensional electron gas 4 is not formed (enhancement mode).

If a positive voltage is applied to the gate electrode, the junction between the p+-AlInAs layer 9 and the n-AlInAs layer 18 is forward biased. At this time, since the n-AlInAs layer 18 has a low electron concentration and this layer is almost perfectly depleted, injection of electrons from the n-AlInAs layer 18 to the p+-AlInAs layer 19 caused by the forward bias can be almost neglected. On the other hand, injection of positive holes from the p+-AlInAs layer 19 to the n-AlInAs layer 18 is remarkable. The injected positive holes would pass through the n-AlInAs layer 18 and would reach the boundary surface between the n-AlInAs layer 18 and the InP layer 2, but since a barrier against positive holes is present here, the positive holes would accumulate at this boundary surface. Most of the accumulated positive holes would move to the side of the n-InGaAs source electrode due to an electric field between the source and the gate. Also, a part of the positive holes would disappear by recombination with electrons. If positive holes accumulate at the n-AlInAs/InP boundary surface, then two-dimensional electrons are induced at this boundary surface in accordance with the amount of the positive holes. As the induced two-dimensional electrons have a high mobility, they flow momentarily to the drain side due to the electric field between the source and the drain, and as a result, two-dimensional electrons are induced again by the positive holes. Accordingly, the positive holes injected from the p+-AlInAs layer 19 would induce a large number of two-dimensional electrons before they are absorbed by the source electrode, and hence a ratio (a current amplification factor $\beta$) of a drain current to a gate current (principally a positive hole current) becomes very large. In addition, since the number of the positive holes injected from the p+-AlInAs layer 19 to the n-AlInAs layer 18 is increased as an exponential function of the forward bias voltage (nearly corresponding to the gate voltage), a mutual conductance also increases exponentially in accordance with increase of the gate voltage, and becomes very large.

In manufacture of the transistor according to the above-described second preferred embodiment, at first as a method of crystal growth, the MBE method was employed, thereby a high purity InP layer 2 of 1 $\mu$m in thickness was grown on a semi-insulating InP substrate 1, and subsequently, an n-AlInAs layer 18 of 300 Å in thickness containing an Si impurity at a concentration of $1 \times 10^{18} \text{cm}^{-3}$ and a p+-AlInAs layer 19 containing a $B_e$ impurity at a concentration of $3 \times 10^{19} \text{cm}^{-3}$ were sequentially grown. Subsequently, Al was vapor deposited and patterned to form a gate electrode 5, then unnecessary p+-AlInAs layer was removed by making use of the gate electrode 5 as a mask, source and drain electrodes 6 and 7 made of AuGe/An were vapor deposited and alloyed, and thereby a transistor was completed. As a result, in a transistor having a gate length of 0.5 $\mu$m, and gate-source and gate-drain distances of 0.5 $\mu$m, the characteristics of gm = 6000 mS/mm (per 1 mm gate width) and $\beta = 100$ were obtained.

While InP/InAlAs only was disclosed as semiconductor materials in the above-described second preferred embodiment, obviously other semiconductor materials (for instance, InAs/GaAsSb) could be employed.

The second and third semiconductor layers 18 and 19 in the above-described second preferred embodiment need not have uniform compositions nor need not be uniformly doped. A super-lattice having a short period may be employed, and variation of compositions and variation of doping in the thicknesswise direction could be given to the semiconductor layers. A super-lattice having a short period has a merit that all the first to third semiconductor layers can be realized by means of two materials. The variation of the composition is important for protection of a surface layer and for facilitating to take ohmic contact (For instance, the second semiconductor layer is gradually varied from n-AlInAs to n-GaInAs.). The variation of the doping is important for the purpose of enhancing an injection efficiency of positive holes (the upper portion of the second semiconductor layer 18 being made to have a low impurity concentration). In addition, with regard to formation of the source and drain electrodes, they could be formed not only on the second semiconductor layer but at the location where this semiconductor layer was dug down, or else, the third semiconductor layer was left and they could be deposited thereon.

As described in detail above, according to the present invention, there is provided a semiconductor device in which a high degree of circuit integration is easy and the entire system can be operated at a super high speed, and so, the effects and advantages of the invention are great.

What is claimed is:

1. A semiconductor device comprising a first semiconductor layer having a low impurity concentration and having a first electron affinity and a first energy sum of electron affinity and energy band gap at an upper surface thereof, an N-type second semiconductor layer provided above said first semiconductor layer and having a second electron affinity and a second energy sum of electron affinity and energy band gap, an intermediate layer interposed between said first and second semiconductor layers and having at a lower surface thereof a third electron affinity smaller than said first electron affinity to form a two-dimensional electron gas layer at a surface of said first semiconductor layer in response to charge in said second semiconductor layer and having at an upper surface thereof a third energy sum of electron affinity and energy band gap larger than said second energy sum, said intermediate layer being of sufficient thickness such that holes cannot penetrate therethrough due to tunnelling effect, a P-type third semiconductor layer forming a PN-junction with said second semiconductor layer, a control electrode connected to said third semiconductor layer so as to form an ohmic contact so that there will be no Schottky barrier with respect to said second semiconductor layer, and a common electrode and an output electrode formed on the opposite sides of said control electrode for electrical coupling to said two-dimensional electron gas layer.

2. A semiconductor device as claimed in claim 1, further comprising means for applying to said control electrode an electrical signal for forward biasing said PN-junction to inject said holes into said second semiconductor layer.

3. A semiconductor device as claimed in claim 2, wherein said first semiconductor layer is GaAs, said second and third semiconductor layers are AlGaAs and said intermediate layer is AlAs.

* * * * *